United States Patent
Kojima et al.

(10) Patent No.: US 6,762,493 B2
(45) Date of Patent: Jul. 13, 2004

(54) MICROWAVE INTEGRATED CIRCUIT

(75) Inventors: Haruo Kojima, Kawasaki (JP); Tomoyuki Kitani, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/385,525

(22) Filed: Mar. 12, 2003

(65) Prior Publication Data

US 2003/0183927 A1 Oct. 2, 2003

(30) Foreign Application Priority Data

Mar. 27, 2002 (JP) ...................................... P2002-087509

(51) Int. Cl.⁷ .............................................. H01L 23/34
(52) U.S. Cl. ........................ 257/727; 257/691; 257/724
(58) Field of Search ................................ 257/728, 691, 257/724

(56) References Cited

U.S. PATENT DOCUMENTS 4,153,888 A * 5/1979 Cote ........................... 333/262
4,947,138 A * 8/1990 Jones ........................... 331/96
5,877,037 A * 3/1999 O'Keefe et al. .............. 438/39
6,437,899 B1 * 8/2002 Noda .......................... 359/245

FOREIGN PATENT DOCUMENTS

JP    4-275482    * 10/1992    ........... H01L/23/12
JP    6-276025      9/1994

* cited by examiner

*Primary Examiner*—Jasmine Clark
(74) *Attorney, Agent, or Firm*—Oblon, Spivak, McClelland, Maier & Neustadt, P.C.

(57) ABSTRACT

A microwave integrated circuit, includes: a dielectric substrate having a signal line on a front surface of the dielectric substrate and a mount pad disposed adjacent to an end of the signal line in a longitudinal direction of the signal line; a semiconductor chip having an upper electrode and a lower electrode provided on opposite surfaces of the semiconductor chip, the lower electrode being mounted on the mount pad; a bonding block connecting a bottom surface of the bonding block to the end in the longitudinal direction of the signal line; and a wiring member configured to bond the upper electrode of the semiconductor chip and a top surface of the bonding block together.

16 Claims, 7 Drawing Sheets

FREQUENCY(GHz)

FREQUENCY : (GHz)

FREQUENCY(GHz)

FREQUENCY : (GHz)

FREQUENCY(GHz)

FREQUENCY : (GHz)

MICROWAVE INTEGRATED CIRCUIT

CROSS REFERENCE TO RELATED APPLICATIONS

This application is based upon and claims the benefit of priority from prior Japanese Patent Application P2002-87509 filed on Mar. 27, 2002; the entire contents of which are incorporated herein by reference.

BACKGROUND OF THE INVENTION

1. Field of the Invention

The present invention relates to a microwave integrated circuit, more specifically, to a structure of a microwave integrated circuit using a chip element.

2. Description of the Related Art

Along with utilization of quasi-millimeter-wave and millimeter-wave bands in recent years, a microwave integrated circuit which can operate efficiently in these bands has been in demand.

A mounting structure of an earlier microwave semiconductor device inside a microwave integrated circuit will be described by use of FIG. 1. FIG. 1 is a view showing an example of a microwave detection circuit in which a detector diode is used as a semiconductor chip 101 and the detector diode is bonded to a microwave transmission line such as a microstrip line.

A lower electrode 103 of a semiconductor chip 101 is soldered to a mount pad 116 with a gold-tin solder or the like. The mount pad 116 is connected to a ground plate 118b of a microstrip line formed on a rear surface of a dielectric substrate 115 through a via hole (not shown) and is thereby grounded. An upper electrode 102 of the semiconductor chip 101 is bonded to a point C on a signal line 118a of a microstrip line formed on a front surface of the dielectric substrate 115, with a bonding wire 111 such as a gold wire. Moreover, in order to provide the semiconductor chip 101 with a direct-current bias, a direct-current bias circuit unit 119 and the signal line 118a are bonded together through a relay bonding pad 117 with bonding wires 111, such as gold wires, having a sufficiently large inductance.

In the detection circuit, a microwave signal is inputted from the signal line 118a, and a detection output is obtained at the direct-current bias circuit section 119. Firstly, an input signal is propagated on the impedance-matched signal line 118a. However, an impedance mismatch occurs at the point C, which is a bonding point to the semiconductor chip 101. The mismatch is due to an influence of the inductance of the bonding wire 111. Accordingly, a standing wave is generated in response to the input signal, and the input signal is thereby attenuated.

In order to reduce the influence of the inductance of the bonding wire 111, the upper electrode 102 of the semiconductor chip 101 and the signal line 118a may be bonded with a shorter distance therebetween. However, a practical length of the bonding wire 111 cannot be short enough because of structural and manufacturing restrictions. Therefore, attenuation of the input signal attributable to generation of the standing wave cannot be avoided. Consequently, the input signal cannot excite the semiconductor chip 101 sufficiently, and it is difficult to obtain a desired detection output.

FIG. 2 shows one example of a voltage standing wave ratio (VSWR) with regard to a frequency of the input signal when observing the semiconductor chip 101 from the point C. Similarly, FIG. 3 shows a Smith chart which exemplifies a frequency locus of an input impedance when observing the semiconductor chip 101 from the point C.

In the case where a pin diode is substituted for the semiconductor chip 101 in the mounting structure in FIG. 1, a voltage standing wave is generated because of the existence of a similar impedance mismatch, and a signal is thereby attenuated.

It is desirable that the value of the VSWR may be in a target range close to 1, and no greater than 2. However, as shown in FIG. 2, the influence of the inductance of the bonding wire 111 increases the VSWR to exceed 2 along with an increase in the frequency over 25 GHz. Particularly, the value exceeds 3 in a millimeter-wave band at 30 GHz and above, whereby signal loss inside the circuit is increased and operation of the integrated circuit becomes impossible. Moreover, in the case when the VSWR is improved by adding an impedance matching circuit, the input impedance at the side of the semiconductor chip 101 as seen from point C has a high inductive impedance at 30 GHz and above as exemplified in FIG. 3. As a consequence, a matching method associated with parallel connection of capacitance components, which is frequently used in the microwave band, is not easily applicable and composition of such a matching circuit becomes difficult.

It is an object of the present invention to provide a microwave integrated circuit which can lower the VSWR inside the integrated circuit even in a quasi-millimeter-wave or millimeter-wave band.

SUMMARY OF THE INVENTION

A first aspect of the present invention inheres in a microwave integrated circuit and includes: a dielectric substrate having a signal line on a front surface of the dielectric substrate and a mount pad disposed adjacent to an end of the signal line in a longitudinal direction of the signal line; a semiconductor chip having an upper electrode and a lower electrode provided on opposite surfaces of the semiconductor chip, the lower electrode being mounted on the mount pad; a bonding block connecting a bottom surface of the bonding block to the end in the longitudinal direction of the signal line; and a wiring member configured to bond the upper electrode of the semiconductor chip and a top surface of the bonding block together.

A second aspect of the present invention inheres in a microwave integrated circuit and includes: a dielectric substrate having first and second signal lines on a front surface of the dielectric substrate, the first and second signal lines aligned on a longitudinal direction, and a mount pad disposed between facing ends of the first and second signal lines in the longitudinal direction; a semiconductor chip having a first electrode disposed on a bottom surface of the semiconductor chip and second and third electrodes disposed on a front surface of the semiconductor chip, the first electrode being mounted on the mount pad; bonding blocks connecting bottom surfaces of the bonding blocks to the respective facing ends of the first and second signal lines; and wiring members respectively configured to bond the second and third electrodes of the semiconductor chip and top surfaces of the bonding blocks together.

DETAILED DESCRIPTION OF THE INVENTION

Figure 1:
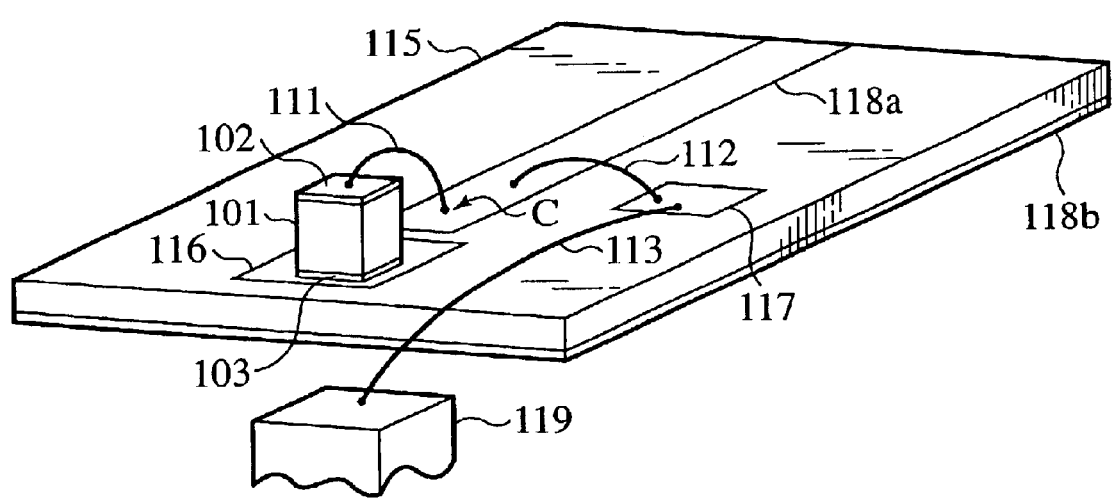
FIG. 1 is a perspective view showing an example of mounting a microwave semiconductor device according to the related art.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

Figure 4A:
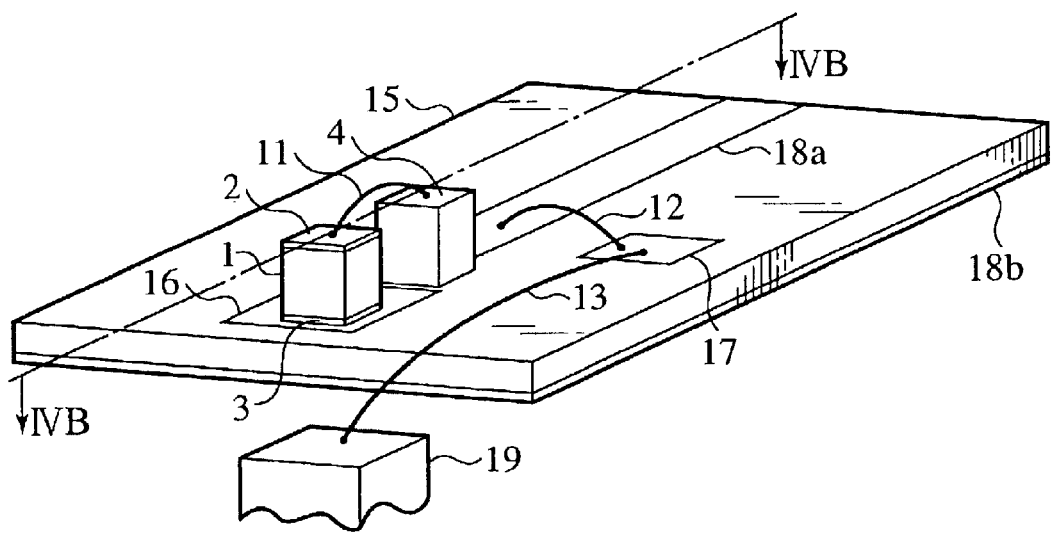
FIG. 4A is a perspective view and FIG. 4B is a cross-sectional view collectively showing an example of mounting a microwave semiconductor device according to a first embodiment of the present invention.

A microwave integrated circuit according to a first embodiment of the present invention is described by use of FIG. 4A through FIG. 6. FIG. 4A is a perspective view of the microwave integrated circuit of the first embodiment of the present invention, which is fabricated into a detection circuit by use of a microwave diode such as a detector diode for a semiconductor chip 1. FIG. 4B is a cross-sectional view taken along the IVB—IVB line in FIG. 4A.

A microwave transmission line formed in a microstrip line configuration according to the first embodiment of the present invention includes a signal line 18a serving as a microstrip conductor such as gold or the like and disposed on a front surface of a dielectric substrate 15, a mount pad 16 disposed adjacent to an end in a longitudinal direction of the signal line 18a, a relay bonding pad 17 disposed in the vicinity of the signal line 18a, and a ground plate 18b made of a conductor such as gold or the like and disposed on a rear surface of the dielectric substrate 15 so as to be opposite to the signal line 18a. Here, the ground plate 18b is connected to the mount pad 16 through a via hole 10. A lower electrode 3 of the semiconductor chip 1 is soldered to the mount pad 16 with a gold-tin solder or the like, and is thereby grounded. Moreover, a bonding block 4 having a conducting property is placed on one end of the signal line 18a in a position close to the semiconductor chip 1, and a bottom surface thereof is bonded to the signal line 18a by soldering with a gold-tin solder or the like. In the first embodiment of the present invention, the bonding block 4 is formed into a metallic cuboid made of gold, gold-plated copper or the like. However, the bonding block 4 may be a block made of a gold-plated insulating material such as silicon dioxide or the like. A thickness $t_B$ of the bonding block 4 is made approximately as thick as a thickness $t_D$ equivalent to the height from a surface of an upper electrode 2 and a surface of the lower electrode 3 of the semiconductor chip 1. The upper electrode 2 of the semiconductor chip 1 and a top surface of the bonding block 4 are bonded to each other with a bonding wire (wiring member) 11 such as a gold wire or the like. Moreover, in order to provide the semiconductor chip 1 with a direct-current bias, the signal line 18a and a direct-current bias circuit unit 19 are connected through the relay bonding pad 17 together with bonding wires 12 and 13 such as gold wires or the like having a sufficiently large inductance.

An input signal is inputted from the other end of the signal line 18a being opposite to the end where the bonding block 4 is placed. A detection output can be obtained from a terminal disposed in the direct-current bias circuit unit 19.

Figure 4B:
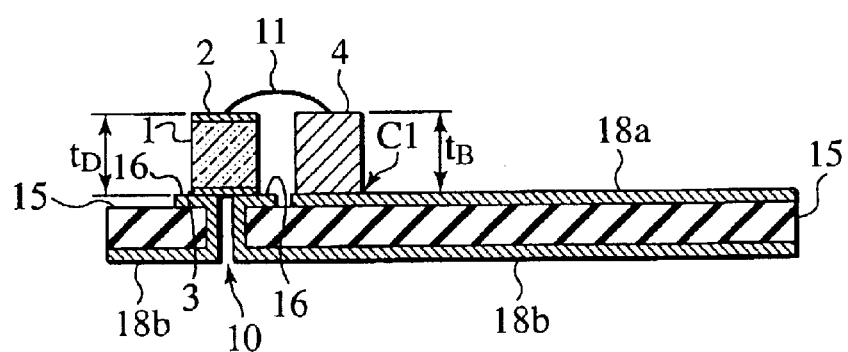

In the bonding configuration shown in FIGS. 4A and 4B, the bonding block 4 is disposed on the signal line 18a and in a position close to the semiconductor chip 1. Moreover, the height of the upper electrode 2 of the semiconductor chip 1 from the dielectric substrate 15 and the height of the top surface of the bonding block 4 from the dielectric substrate 15 are approximately equal. Thus, it is possible to shorten a bonding distance between the upper electrode 2 of the semiconductor chip 1 and the top surface of the bonding block 4. Therefore, it is possible to reduce the inductance of the bonding wire 11 and a loss of the signal by suppressing generation of a voltage standing wave.

Figure 5:
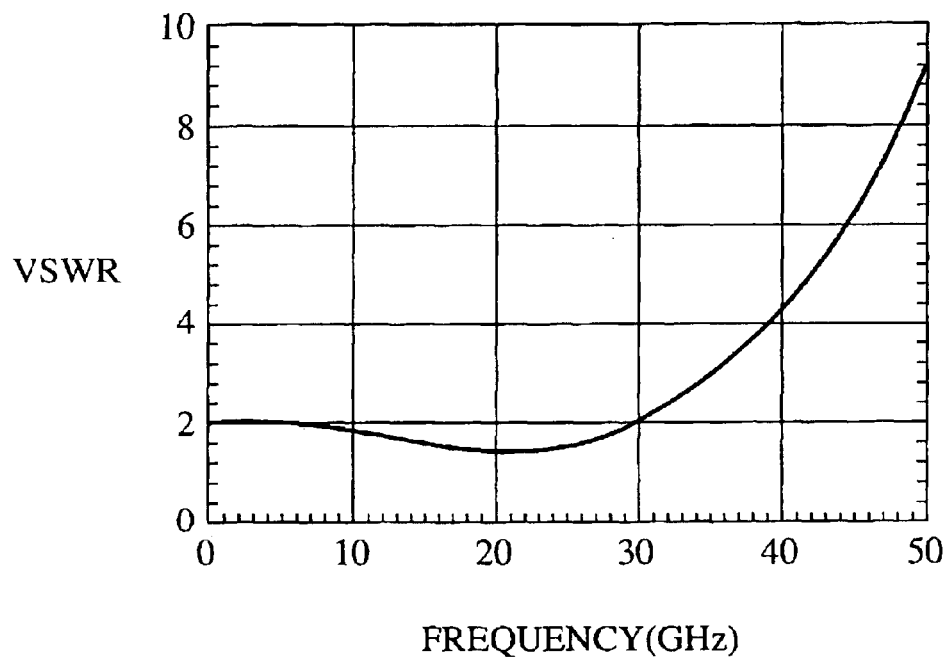
FIG. 5 is a graph showing an example of a frequency characteristic of a VSWR in the first embodiment of the present invention.
Figure 6:
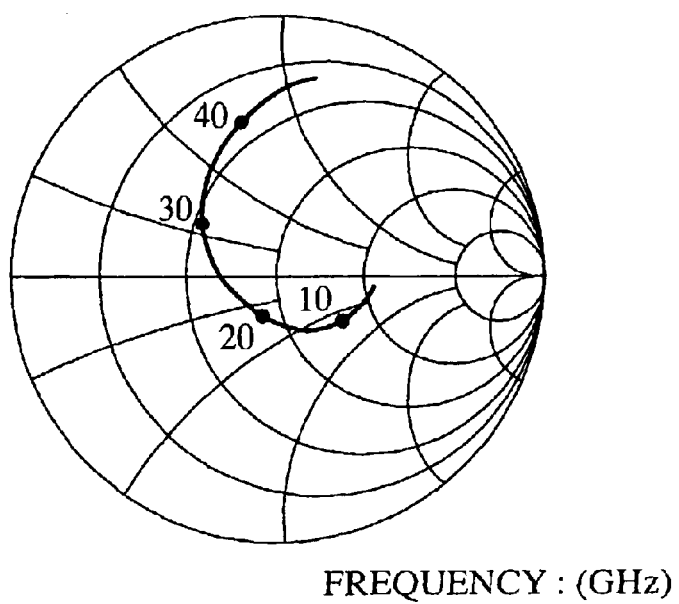
FIG. 6 is a Smith chart showing an example of a locus of input impedance in the first embodiment of the present invention.

With regard to an effect attributable to a reduction in the inductance, FIG. 5 shows an example of the dependence of a VSWR on a frequency of the input signal as seen on the side of the semiconductor chip 1, through the bonding block 4, from a point C1, which is a bonding point of the signal line 18a and the bottom surface of the bonding block 4. FIG. 6 is a Smith chart showing an example of a frequency locus of an input impedance in the same case.

Figure 2:
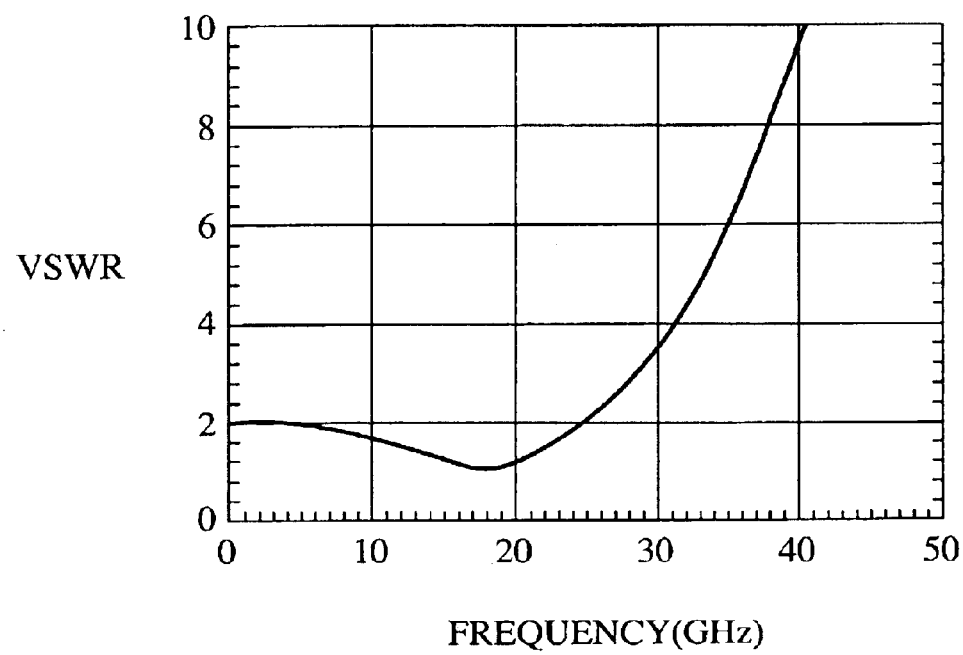
FIG. 2 is a graph showing an example of a frequency characteristic of a VSWR in the example of mounting a microwave semiconductor device according to the related art.
Figure 3:
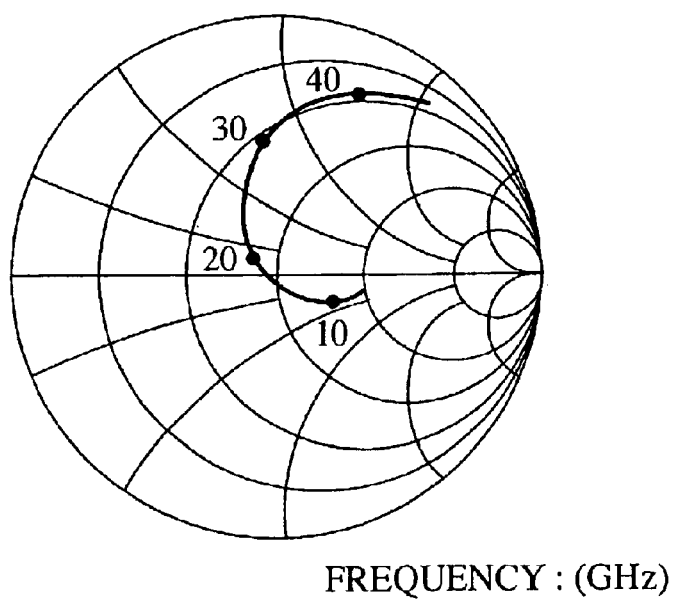
FIG. 3 is a Smith chart showing an example of a locus of input impedance in the example of mounting a microwave semiconductor device according to the related art.

As compared with FIG. 2 of the earlier example, FIG. 5 shows that the microwave integrated circuit according to the first embodiment of the present invention can reduce an increase of the VSWR in a wider frequency band. In particular, a remarkable reduction effect can be obtained in a millimeter-wave band at the frequency of 25 GHz and above. Also, as compared with FIG. 3 of the earlier example, FIG. 6 particularly shows that the impedance in the millimeter-wave band at 30 GHz and above has a low inductive impedance in the first embodiment of the present invention. Therefore, a matching method associated with parallel connection of capacitance components is applicable in the case of adding a matching circuit. Accordingly, composition of the matching circuit can be simplified and facilitated.

As described above, according to the first embodiment of the present invention, it is possible to suppress a VSWR in an integrated circuit even in a millimeter-wave band, whereby a microwave integrated circuit can be achieved.

Second Embodiment

Figure 7A:
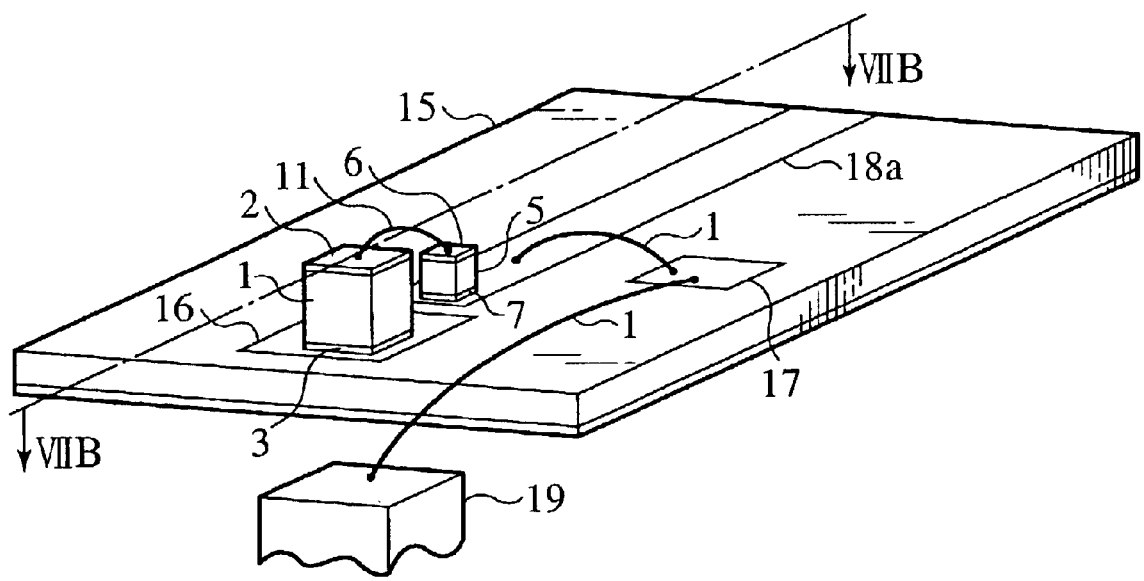
FIG. 7A is a perspective view and FIG. 7B is a cross-sectional view collectively showing a second embodiment of the present invention.
Figure 7B:
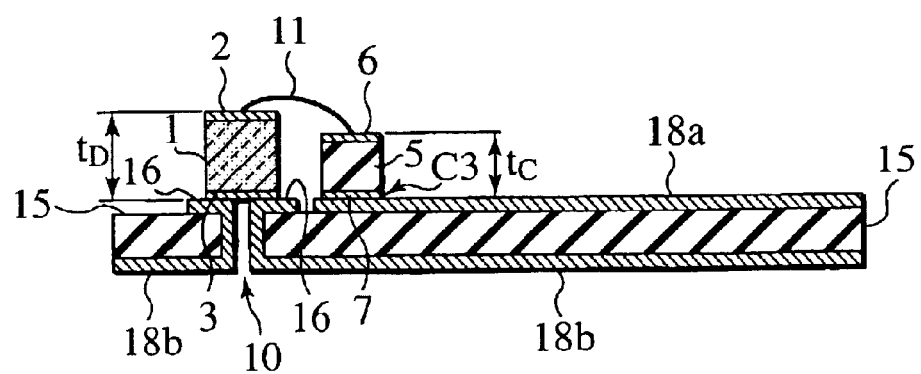

As shown in a perspective view of FIG. 7A and in a cross-sectional view of FIG. 7B taken along the VIIB—VIIB line in FIG. 7A, a microwave integrated circuit according to a second embodiment of the present invention is characterized in that a detection circuit is fabricated by use of a microchip capacitor 5 instead of the conductive bonding block utilized in the first embodiment. Since other constitutions are similar to those in the first embodiment of the present invention, duplicate description will be omitted herein.

The microchip capacitor 5 to be used in the detection circuit according to the second embodiment of the present invention includes an upper electrode 6 and a lower electrode 7 respectively disposed on an upper part and a lower part of the microchip capacitor 5, and has a thickness including the upper and lower electrodes 6 and 7 which is denoted as $t_C$. The microchip capacitor 5 is placed on a signal line 18a in a position close to a semiconductor chip 1, and the lower electrode 7 thereof is bonded to the signal line 18a by soldering with a gold-tin solder or the like. Moreover, an upper electrode 2 of the semiconductor chip 1 and the upper electrode 6 of the microchip capacitor 5 are bonded to each other with a bonding wire 11 such as a gold wire.

In the bonding configuration shown in FIGS. 7A and 7B, the microchip capacitor 5 is disposed on the signal line 18a and in a position close to the semiconductor chip 1. Accordingly, it is possible to shorten the bonding distance between the upper electrode 2 of the semiconductor chip 1 and the upper electrode 6 of the microchip capacitor 5. At the same time, by use of a capacitance component of the microchip capacitor 5 it is possible to equivalently reduce the inductance of the bonding wire 11. Therefore, it is possible to reduce loss of a signal by suppressing generation of a voltage standing wave.

Figure 8:
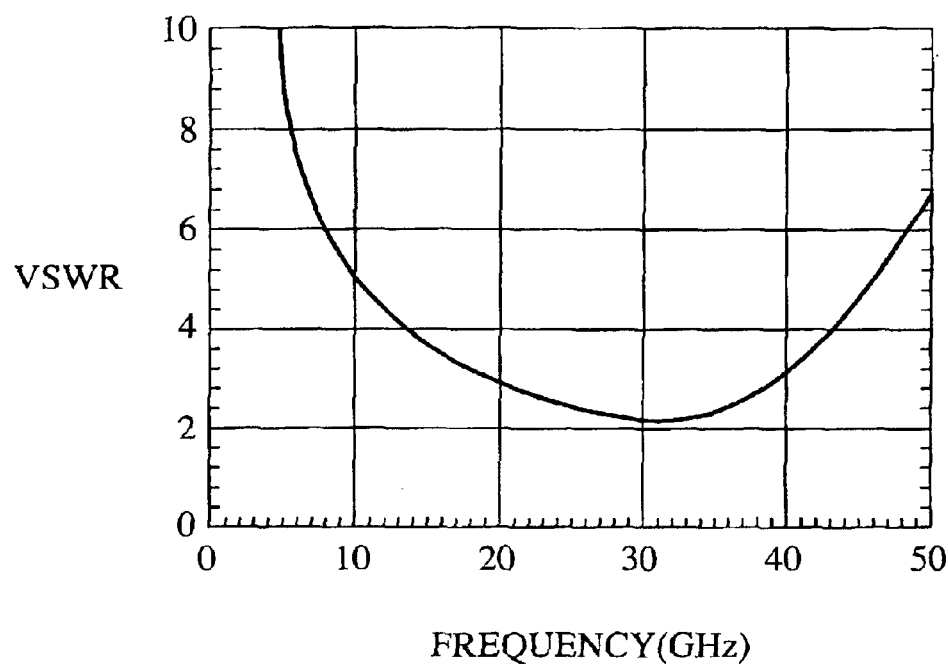
FIG. 8 is a graph showing an example of a frequency characteristic of a VSWR in the second embodiment of the present invention.
Figure 9:
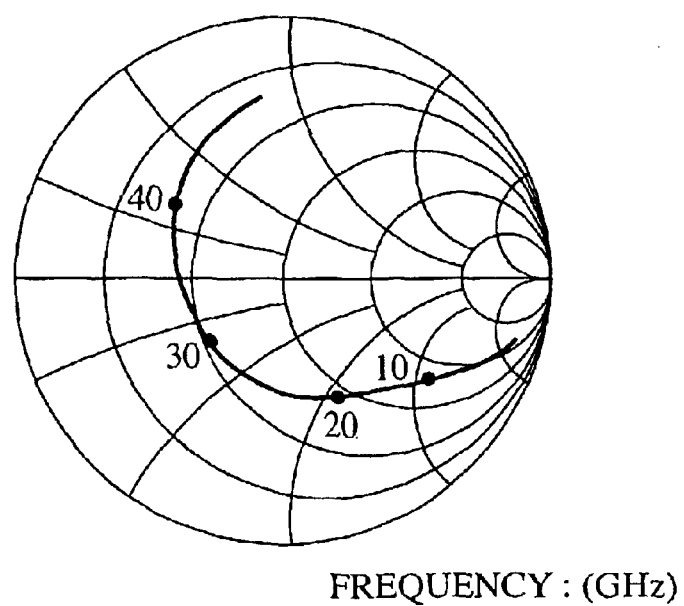
FIG. 9 is a Smith chart showing an example of a locus of input impedance in the second embodiment of the present invention.

With regard to an effect attributable to a reduction in the inductance, FIG. 8 shows one example of the dependence of a VSWR on a frequency of an input signal as seen on the side of the semiconductor chip 1, through the microchip capacitor 5, from a point C3 which is a bonding point of the signal line 18a and the lower electrode 7 of the microchip capacitor 5. FIG. 9 is a Smith chart showing one example of a frequency locus of an input impedance in the same case.

As compared with FIG. 2 of the earlier example, FIG. 8 shows that the microwave integrated circuit according to the second embodiment of the present invention can achieve a remarkable reduction effect in the VSWR, particularly in the millimeter-wave band at the frequency of 25 GHz and above. Also, when the impedance in a higher millimeter-wave band such as a frequency of 40 GHz in FIG. 9 is compared with the relevant impedance in FIG. 3 of the earlier example, the microwave integrated circuit according to the second embodiment of the present invention has low inductive impedance. Such an aspect shows that a matching method associated with parallel connection of capacitance components is applicable in the case of adding a matching circuit. Accordingly, composition of the matching circuit can be simplified and facilitated.

As described above, according to the second embodiment, it is possible to achieve a microwave integrated circuit in which a VSWR in the integrated circuit is suppressed even in a millimeter-wave band.

Third Embodiment

Figure 10A:
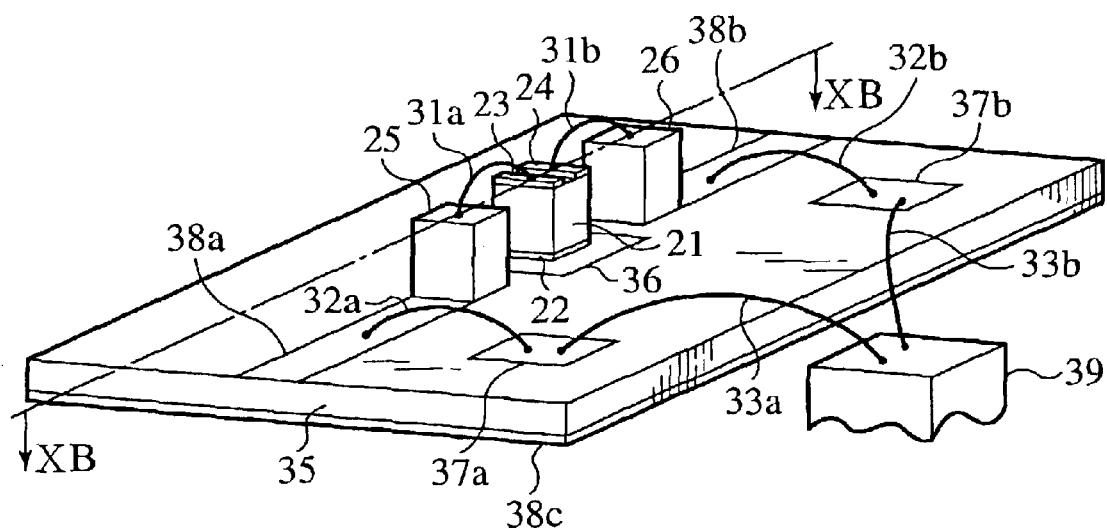
FIG. 10A is a perspective view and FIG. 10B is a cross-sectional view collectively showing a third embodiment of the present invention.
Figure 10B:
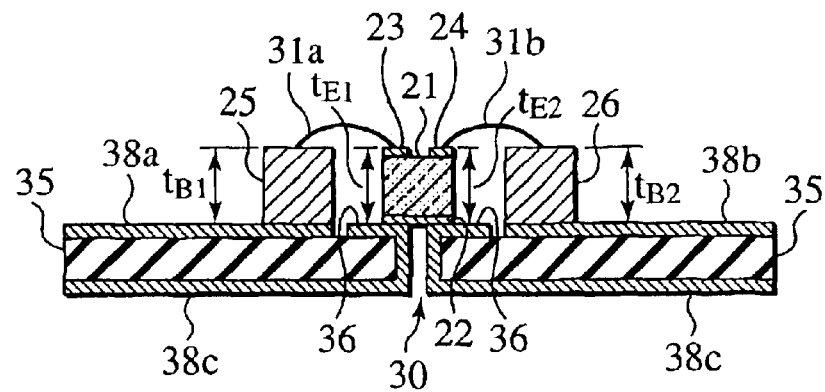

As shown in a perspective view of FIG. 10A and in a cross-sectional view of FIG. 10B taken along the XB—XB line in FIG. 10A, a microwave integrated circuit according to a third embodiment of the present invention is an example constructed as an amplification circuit by use of a three-terminal active element such as a field-effect transistor (FET) or a bipolar transistor (BPT) for a semiconductor chip 21 and by use of conductive blocks respectively for bonding blocks 25 and 26. A microwave transmission line formed in a microstrip line configuration according to the third embodiment of the present invention includes a first signal line 38a and a second signal line 38b made of microstrip conductors such as gold and disposed on a front surface of a dielectric substrate 35, a mount pad 36 disposed between the facing ends in the longitudinal direction of the first and second signal lines 38a, 38b, relay bonding pads 37a and 37b respectively disposed in the vicinity of the first and second signal lines 38a, 38b, and a ground plate 38c made of a conductor such as gold and disposed on a rear surface of the dielectric substrate 35 so as to be opposite to the first and second signal lines 38a, 38b. Here, the ground plate 38c is connected to the mount pad 36 through a via hole 30.

A first electrode 22 on a bottom surface of the semiconductor chip 21 is soldered to the mount pad 36 with a gold-tin solder or the like, and is thereby grounded. A second electrode 23 and a third electrode 24 are disposed on a top surface of the semiconductor chip 21. Moreover, bonding blocks 25 and 26 are respectively placed on the first and second signal lines 38a, 38b in positions close to the semiconductor chip 21, and bottom surfaces thereof are respectively bonded to the first and second signal lines 38a, 38b by soldering with gold-tin solders or the like. In the third embodiment, the bonding blocks 25 and 26 are formed into metallic cuboids made of gold, gold-plated copper or the like. However, the bonding blocks 25 and 26 may be made of a gold-plated insulating material such as silicon dioxide. Thicknesses $t_{B1}$, and $t_{B2}$ of the bonding blocks 25 and 26 are made approximately as thick as the heights $t_{E1}$ and $t_{E2}$ of the second and the third electrodes 23, 24, which are bonding targets, of the semiconductor chip 21 from the dielectric substrate 35, respectively. Moreover, the second electrode 23 of the semiconductor chip 21 and a top surface of the bonding block 25, and the third electrode 24 of the semiconductor chip 21 and a top surface of the bonding block 26, are respectively bonded together with bonding wires 31a and 31b such as gold wires. Furthermore, in order to provide the semiconductor chip 21 a direct-current bias, a direct-current bias circuit unit 39 and the first and second signal lines 38a, 38b of the microwave transmission lines are connected through the relay bonding pads 37a and 37b, and are respectively bonded together with bonding wires 32a, 32b, 33a, and 33b such as gold wires having a sufficiently large inductance.

As the amplification circuit, for example, a signal is inputted from the first signal line 38a and an amplification output is obtained at the second signal line 38b.

In the microwave transmission lines according to the third embodiment of the present invention, the bonding blocks 25 and 26 are respectively disposed on the first and second signal lines 38a, 38b and in positions close to the semiconductor chip 21. Moreover, the heights $t_{E1}$ and $t_{E2}$ of the second electrode 23 and the third electrode 24 of the semiconductor chip 21, from the dielectric substrate 35, are approximately equal to the thicknesses $t_{B1}$ and $t_{B2}$ of the bonding blocks 25 and 26, respectively. In this way, it is possible to shorten the bonding distance between the second electrode 23 of the semiconductor chip 21 and the top surface of the bonding block 25 as well as the bonding distance between the third electrode 24 of the semiconductor chip 21 and the top surface of the bonding block 26, respectively. Therefore, it is possible to reduce the inductance of the bonding wires 31a and 31b, and to reduce the loss of a signal by suppressing generation of voltage standing waves.

An effect attributable to reduction in the inductance can be achieved similar to the first embodiment of the present invention. In other words, a remarkable reduction of the VSWRs can be achieved particularly in a frequency band at 25 GHz and above. Moreover, configuration of a matching circuit can be simplified and facilitated when adding an impedance matching circuit particularly in the millimeter-wave band at 30 GHz and above.

As described above, according to the third embodiment, it is possible to achieve a microwave integrated circuit in which a VSWR in the integrated circuit is suppressed even in a millimeter-wave band.

Other Embodiments

Description has been made in the first and the second embodiments of the present invention by using a detection circuit as the microwave integrated circuit. However, a similar effect of reduction in the inductance of the bonding wire can also be achieved in the case of a phase shift circuit by use of a pin diode as a microwave diode instead of the detector diode. Therefore, it is possible to achieve a microwave integrated circuit in which a VSWR in the integrated circuit is suppressed. Moreover, it is needless to say that a similar effect can also be achieved in a frequency multiplication circuit or an oscillating circuit using a step recovery diode as a microwave diode, or in an oscillating circuit using a Gunn diode as a microwave diode.

Moreover, description has been made in the first to third embodiments of the present invention by using a microstrip line as the microwave transmission line. However, it is also possible to shorten the bonding distance by use of a bonding wire even in the case of adopting a coplanar waveguide configuration or a suspended strip line configuration instead of the microstrip line configuration. Accordingly, an effect of reduction in the inductance of the bonding wire can be achieved in a similar manner.

Furthermore, although bonding of the semiconductor chip and the bonding block has been performed by use of a bonding wire such as a gold wire in the first to third embodiments of the present invention, it is needless to say that a metallic ribbon made of gold or the like is also applicable instead of the bonding wire. For example, use of a gold ribbon provides further reduction in resistance and inductance as compared to a gold bonding wire. Accordingly, it is possible to achieve a microwave integrated circuit in which the VSWR in the integrated circuit is suppressed in a millimeter-wave band.

Various modifications will become possible for those skilled in the art after receiving the teachings of the present disclosure without departing from the scope thereof.

What is claimed is:

1. A microwave integrated circuit, comprising:
   a dielectric substrate having a signal line on a front surface of the dielectric substrate and a mount pad disposed adjacent to an end of the signal line in a longitudinal direction of the signal line;
   a semiconductor chip having an upper electrode and a lower electrode provided on opposite surfaces of the semiconductor chip, the lower electrode being mounted on the mount pad;
   a bonding block connecting a bottom surface of the bonding block to the end in the longitudinal direction of the signal line; and
   a wiring member configured to bond the upper electrode of the semiconductor chip and a top surface of the bonding block together.

2. The microwave integrated circuit of claim 1, wherein the semiconductor chip and the bonding block are approximately the same height.

3. The microwave integrated circuit of claim 1, wherein the semiconductor chip is a microwave diode.

4. The microwave integrated circuit of claim 3, wherein the microwave diode is a detector diode to be used in a detection circuit and the bonding block is a conductive block.

5. The microwave integrated circuit of claim 3, wherein the microwave diode is a detector diode to be used in a detection circuit and the bonding block is a microchip capacitor.

6. The microwave integrated circuit of claim 3, wherein the microwave diode is a pin diode to be used in a phase shift circuit and the bonding block is a conductive block.

7. The microwave integrated circuit of claim 3, wherein the microwave diode is a pin diode to be used in a phase shift circuit and the bonding block is a microchip capacitor.

8. The microwave integrated circuit of claim 2, wherein the semiconductor chip is a microwave diode.

9. The microwave integrated circuit of claim 8, wherein the microwave diode is a detector diode to be used in a detection circuit and the bonding block is a conductive block.

10. The microwave integrated circuit of claim 8, wherein the microwave diode is a detector diode to be used in a detection circuit and the bonding block is a microchip capacitor.

11. The microwave integrated circuit of claim 8, wherein the microwave diode is a pin diode to be used in a phase shift circuit and the bonding block is a conductive block.

12. The microwave integrated circuit of claim 8, wherein the microwave diode is a pin diode to be used in a phase shift circuit and the bonding block is a microchip capacitor.

13. A microwave integrated circuit, comprising:
   a dielectric substrate having first and second signal lines on a front surface of the dielectric substrate, the first and second signal lines aligned on a longitudinal direction, and a mount pad disposed between facing ends of the first and second signal lines in the longitudinal direction;
   a semiconductor chip having a first electrode disposed on a bottom surface of the semiconductor chip and second and third electrodes disposed on a front surface of the semiconductor chip, the first electrode being mounted on the mount pad;
   bonding blocks connecting bottom surfaces of the bonding blocks to the respective facing ends of the first and second signal lines; and
   wiring members respectively configured to bond the second and third electrodes of the semiconductor chip and top surfaces of the bonding blocks together.

14. The microwave integrated circuit of claim 13, wherein the semiconductor chip and the bonding blocks are approximately the same height.

15. The microwave integrated circuit of claim 13, wherein the semiconductor chip is a three-terminal active element and the bonding blocks are conductive blocks.

16. The microwave integrated circuit of claim 14, wherein the semiconductor chip is a three-terminal active element and the bonding blocks are conductive blocks.

* * * * *